(12) United States Patent  
Kondo

(10) Patent No.: US 6,597,720 B2  
(45) Date of Patent: Jul. 22, 2003

(54) SURFACE EMITTING SEMICONDUCTOR LASER AND METHOD OF MANUFACTURING THE SAME

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 33 days.

(21) Appl. No.: 09/820,730

(22) Filed: Mar. 30, 2001

(65) Prior Publication Data

US 2002/0044582 A1 Apr. 18, 2002

(30) Foreign Application Priority Data

Mar. 31, 2000 (JP) .......................................... 2000-098766

(51) Int. Cl.⁷ .............................................. H01S 5/183
(52) U.S. Cl. .......................................... 372/96; 372/108
(58) Field of Search ..................................... 372/96, 108

(56) References Cited

U.S. PATENT DOCUMENTS 5,553,089 A * 9/1996 Seki et al. ..................... 372/43

FOREIGN PATENT DOCUMENTS

| JP | 2000-67449 A | 3/2000 |
| JP | 2000-76682 A | 3/2000 |
| JP | 2000-101185 A | 4/2000 |

* cited by examiner

Primary Examiner—James Davie  
(74) Attorney, Agent, or Firm—Oliff & Berridge PLC

(57) ABSTRACT

A surface emitting semiconductor laser of the present invention has a resonator including a pillar-form portion, and an emission portion having a convex lens form is formed on an upper surface of the pillar portion. The pillar-form portion has an embedded structure, with the periphery of the pillar-form portion embedded in an embedding layer. The embedding layer is formed of a substance having non-affinity with the material used to form the emission portion.

7 Claims, 10 Drawing Sheets

SURFACE EMITTING SEMICONDUCTOR LASER AND METHOD OF MANUFACTURING THE SAME

Japanese Patent Application No. 2000-98766, filed on Mar. 31, 2000, is hereby incorporated by reference in its entirety.

BACKGROUND OF THE INVENTION

1. Field of the Invention

The present invention relates to a surface emitting semiconductor laser which emits laser light in a direction perpendicular to a semiconductor substrate, and a method of manufacturing the surface emitting semiconductor laser.

2. Description of Related Art

A surface emitting semiconductor laser is a semiconductor laser which emits laser light in a direction perpendicular to a semiconductor substrate, with a resonator provided on a semiconductor substrate in a direction perpendicular to the semiconductor substrate. This resonator generates then emits the laser light, and comprises a reflecting layer, active layer, and reflecting layer, in that order.

Outstanding characteristics that can be cited of a surface emitting semiconductor laser compared with an end-surface laser, are that the direction of laser emission is uniform, and can be made small, and it therefore provides high efficiency coupling of optical elements. A surface emitting semiconductor laser therefore holds great promise in application as a light source particularly in optic fiber communications using for example terminal large-diameter core optic fiber.

In terminal optic fiber communications, it is required for the structure of an optical transmission module to be simplified, for the installation to be made easier, and for the cost to be reduced. Since a surface emitting semiconductor laser is suited to a large-diameter core optic fiber, such as for example a plastic optic fiber or the like, and the method may be considered in which no lens is provided between the optic fiber and the light source, and the laser light is emitted directly into the optic fiber, to improve the optical efficiency. By this method, since the laser light can be emitted efficiently into the optic fiber, an optical transmission module of extreme simplicity can be realized.

However, plastic optic fibers have the drawback that the light losses are large, and when a long transmission path is required, a light source with a high power laser light output is required. As one means of increasing the laser light output of a surface emitting semiconductor laser may be cited an increase in the laser light emission aperture. However, if the laser light emission aperture is made larger, the problem occurs that the laser light emission angle increases. An increase in the laser light emission angle invites a loss of coupling efficiency and a decrease in the fitting margins, and this makes it difficult to simplify the structure of an optical communications module. That is to say, it has been difficult to achieve the twin aims of ensuring the transmission distance, while simplifying the structure of the optical communications module.

SUMMARY OF THE INVENTION

The objective of the present invention is the provision of a surface emitting semiconductor laser and method of manufacturing the surface emitting semiconductor laser, such that a high laser output is obtained, and the laser emission angle is narrow.

(A) According to the present invention, there is provided a surface emitting semiconductor laser which has a resonator formed on a semiconductor substrate in a direction perpendicular to the semiconductor substrate, to emit laser light from the resonator in a direction perpendicular to the semiconductor substrate, wherein:

a pillar-form semiconductor deposition is provided in at least part of the resonator;

an emission portion having a convex lens form is formed on an upper surface of the semiconductor deposition;

the semiconductor deposition has an embedded structure, and is embedded in an embedding layer; and the embedding layer is formed from a substance having non-affinity with a material used to form the emission portion.

By a substance having non-affinity with the material used to form the emission portion is indicated a substance whose properties are such as to repel the material used to form the emission portion. Therefore, the material used to form the emission portion has low wettability with respect to the substance.

As the substance having non-affinity with the material used to form the emission portion may be cited an inorganic material or a resin. For example, in the case of a resin, a fluorine-based resin can be used.

By means of this structure, a high laser output can be obtained, and the laser emission angle of the surface emitting semiconductor laser can be made narrow. This is described in more detail in the embodiments of the present invention.

This surface emitting semiconductor laser has some features as shown by following examples (1) to (3).

(1) An electrode which supplies current to the resonator may be formed on the upper surface of the semiconductor deposition.

In this case, the electrode may be formed of a metal.

(2) The diameter of the emission portion in a plane of adhesion of the semiconductor deposition and the emission portion, and the diameter of the upper surface of the semiconductor deposition may be substantially equal. By means of this structure, since the diameter of the emission portion in the plane of adhesion of the semiconductor deposition and the emission portion can be made equal to the diameter of the upper surface of the semiconductor deposition, particularly for surface emitting semiconductor lasers formed in an array, emission portions of matching sizes can be formed. Since the diameter of the upper surface of the semiconductor deposition and the diameter of the emission portion in the plane of adhesion of the semiconductor deposition and the emission portion substantially coincide, the optical axis of the emission portion, and the axis passing through the center of the semiconductor deposition and perpendicular to the upper surface of the semiconductor deposition substantially coincide. Further, the optical axis of the emitted laser light is substantially coincident with the axis passing through the center of the semiconductor deposition and perpendicular to the upper surface of the semiconductor deposition. Therefore, the optical axis of the emission portion, the optical axis of the laser light, and the axis passing through the center of the semiconductor deposition and perpendicular to the upper surface of the semiconductor deposition substantially coincide, as a result of which a surface emitting semiconductor laser with little deviation from the optical axis can be obtained.

(3) The emission portion may be formed of a polymer compound.

(B) According to the present invention, there is provided a method of manufacturing a surface emitting semiconductor laser comprising the steps of:

(a) forming a resonator including a pillar-form semiconductor deposition on a semiconductor substrate;

(b) forming an electrode which supplies current to the resonator in a state with a predetermined region of an upper surface of the semiconductor deposition exposed;

(c) forming an embedding layer around the semiconductor deposition to give the semiconductor deposition an embedded structure by embedding the periphery of the semiconductor deposition in a substance having non-affinity with a liquid which is used to form an emission portion having a convex lens form by curing;

(d) disposing the liquid on the upper surface of the semiconductor deposition; and (e) curing the liquid to form the emission portion.

The liquid refers to the material used to form the emission portion, and by a substance having non-affinity with the liquid is indicated a substance whose properties are such as to repel the liquid. That is to say, the liquid has the property of low wettability with respect to the substance.

According to this method, the periphery of the semiconductor deposition is embedded in the substance having non-affinity with the liquid, whereby an embedding layer is formed on the periphery of the semiconductor deposition, and the resonator is given an embedded structure, while further, by simply supplying the liquid to the upper surface of the semiconductor deposition, and curing the liquid, the emission portion functioning as a microlens can be formed by self-alignment. That is to say, there is a large difference in the wettability by the liquid of the upper surface of the semiconductor deposition and the surface of the embedding layer, whereby the liquid is spontaneously formed by surface tension into a convex lens form, and by curing this an emission portion having the form of a convex lens can be obtained. As above, with the surface emitting semiconductor laser of the present invention, since the emission portion can be formed with self-alignment, a laser emission portion requiring no alignment of the optical axis, and with no deviation from the optical axis can be formed by a process of extreme simplicity.

In the process, the substance may be a resin.

In this case, as the resin a fluorine-based resin may be used. A fluorine-based resin has non-affinity with almost any type of resin liquid. On the other hand, the semiconductor layer or electrode surface of the surface emitting semiconductor laser has affinity with almost all types of resin liquid. As a result, by using a fluorine-based resin, a large difference between the wettability of the upper surface of the semiconductor deposition by the liquid and the wettability of the surface of the embedding layer formed of the resin by the liquid can be achieved, and the liquid can be caused to adhere only to the upper surface of the semiconductor deposition. As a result, the size can be controlled, and an emission portion can be obtained with even less deviation from the optical axis.

In step (d), as the means of supplying the liquid to the upper surface of the semiconductor deposition, the following two methods can be cited by way of example.

In the first method, a drop of the liquid is formed on a tip of a dispenser nozzle, and the drop is contacted with the upper surface of the semiconductor deposition, whereby the liquid is disposed on the upper surface.

According to this method, by using the nozzle, the viscosity of the liquid, the nozzle bore, and the drop size on the tip of the nozzle can be adjusted, surface treatment can be applied to the nozzle tip, and so on, so that the thickness of the emission portion can easily be controlled. The method of supply of the liquid by a nozzle is not susceptible to the influence of the viscosity of the liquid, and therefore the range of liquids that can be used is wider. Further, since the liquid is positively supplied only to where it is required, and therefore waste is eliminated, and liquid does not adhere to places in which it is not required.

In the second method, by using an inkjet head the liquid is ejected to the upper surface of the semiconductor deposition, thus disposing the liquid on the upper surface.

By means of this method of using an inkjet head, the liquid can be supplied to the surface in a short time, which provides the characteristic of high productivity.

In the above process, the liquid may include a thermosetting resin, ultraviolet cured resin, or a precursor of the thermosetting resin or ultraviolet cured resin.

DETAILED DESCRIPTION OF THE EMBODIMENT

The present invention is now described in terms of an embodiment, with reference to the drawings.

Device Configuration

Figure 1:
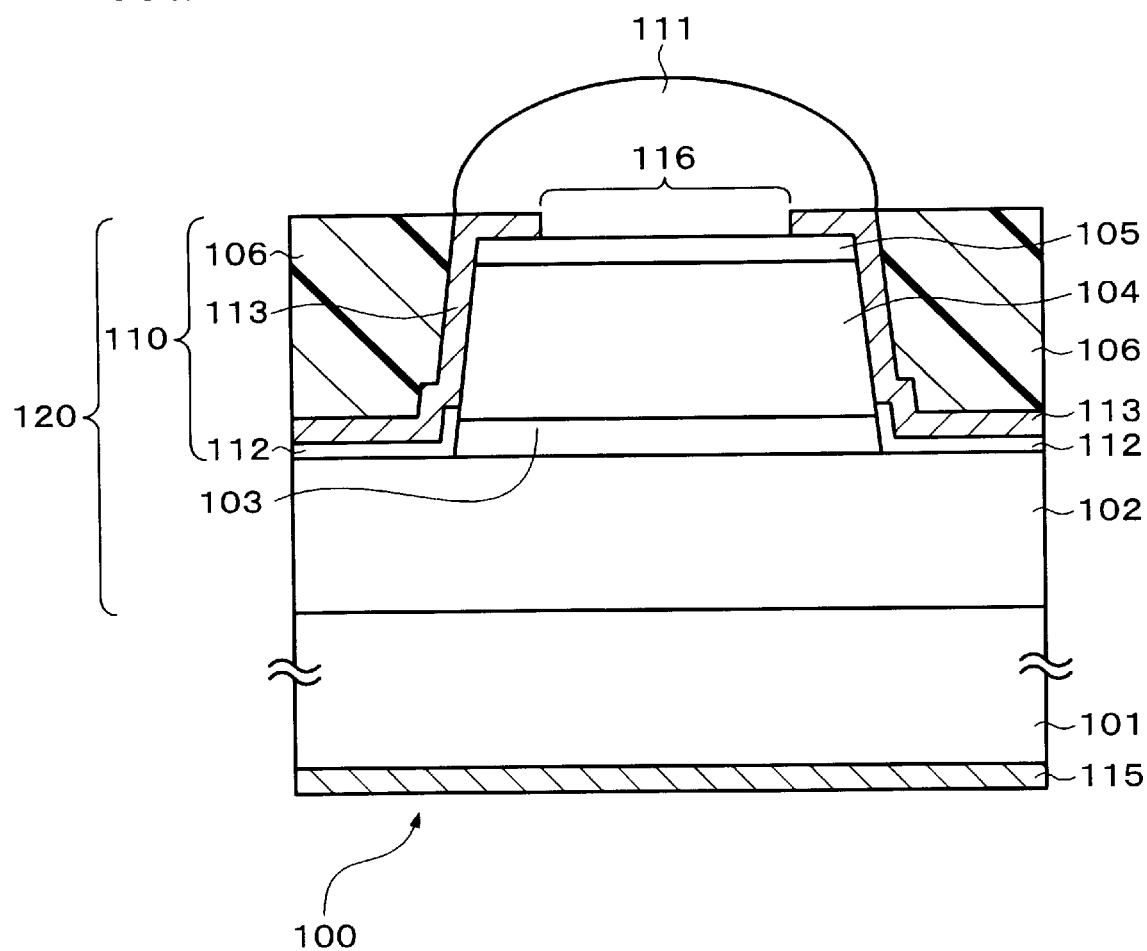
FIG. 1 schematically shows a cross-section of one embodiment of the surface emitting semiconductor laser of the present invention.

FIG. 1 schematically shows a cross-section of an embodiment of the surface emission laser of the present invention.

A surface emission laser 100 shown in FIG. 1 comprises a resonator 120 including a pillar portion 110 formed on a semiconductor substrate 101. The resonator 120 is formed by lamination of a lower mirror 102, an active layer 103, an upper mirror 104, and a contact layer 105.

The resonator 120 has, on a semiconductor substrate 101 of n-type GaAs, a buffer layer of n-type GaAs (not shown in the drawings), a distributed reflection type multilayer film mirror (hereinafter referred to as the "lower mirror") 102 of 30 pairs of alternately laminated n-type $Al_{0.2}Ga_{0.8}As$ and n-type $Al_{0.9}Ga_{0.1}As$, an n-type cladding layer (not shown in the drawings) of n-type $Al_{0.5}Ga_{0.5}As$, an active layer 103 comprising 4-nm thickness GaAs well layers and 4-nm thickness $Al_{0.3}Ga_{0.7}As$ barrier layers in which the well layers form a three-layer quantum well structure, a p-type cladding layer (not shown in the drawings) of $Al_{0.5}Ga_{0.5}As$, distributed reflection type multilayer film mirror (hereinafter referred to as the "upper mirror") 104 of 30 pairs of alternately laminated p-type $Al_{0.2}Ga_{0.8}As$ and p-type $Al_{0.9}Ga_{0.1}As$, and a contact layer 105, in that order.

The upper mirror 104 is doped with Zn, making it p-type, while the lower mirror 102 is doped with Se, making it n-type. As a result, the upper mirror 104, active layer 103 not doped with any impurities, and the lower mirror 102 form a pin diode.

The contact layer 105 is such as not to repel the liquid described below. That is to say, the wettability of the contact layer 105 by the liquid described below is high. The contact layer 105 must be of a material capable of ohmic contact with an upper electrode 113. When the contact layer 105 is formed of an AlGaAs material, for example, it is doped with a concentration of impurities not exceeding $5 \times 10^{18}$ cm$^{-3}$ to form $Al_{0.2}Ga_{0.8}As$.

The resonator 120 has, as described above, the pillar portion 110 formed, including the contact layer 105, upper mirror 104, and active layer 103. Here the "pillar portion" refers to the semiconductor deposition in the form of a pillar formed on the resonator 120. On the upper surface of the pillar portion 110 is provided a laser light emission portion 111.

The pillar portion 110 has an embedded structure. That is to say, the pillar portion 110 has its periphery embedded in an embedding layer 106. The embedding layer 106 is formed of a substance having non-affinity with the material used to form the emission portion 111 described below. As this substance may be cited for example an inorganic material or resin. When this substance is a resin, for example a fluorine-based resin can be used. In this embodiment, the case is shown that the substance having non-affinity with the material used to form the emission portion 111 is a resin.

Further, an insulating layer 112 is formed to cover a part of the lateral surface of the pillar portion 110 and the upper surface of the lower mirror 102.

Then the upper electrode 113 is formed, for example, of titanium, platinum, and gold sequentially deposited in metal layers, or chromium, gold-zinc alloy, and gold sequentially deposited in metal layers, or the like, and on the upper surface of the pillar portion 110 contacts the contact layer 105 in a ring shape, and covers the exposed lateral surface of the pillar portion 110 and the surface of the insulating layer 112. Since the upper electrode 113 contacts the contact layer 105 in a ring shape, an aperture 116 is formed on the upper surface of the pillar portion 110. In the aperture 116, the contact layer 105 and the emission portion 111 described below contact. It should be noted that in this embodiment, the case has been described that the surface of the metal layers constituting the upper electrode 113 is a metal layer, but as long as it makes intimate contact with the embedding layer 106, this is not a particular restriction of the invention.

On the reverse side of the semiconductor substrate 101 (the surface of the semiconductor substrate 101 opposite to that on which the resonator 120 is formed), a lower electrode 115 is formed, for example, of sequentially deposited Au—Ge alloy, nickel, and gold.

Further, the emission portion 111 is provided on the upper surface of the pillar portion 110, to be surrounded by the upper electrode 113. The emission portion 111 is transparent, and has the shape of a convex lens. That is to say, the upper surface of the emission portion 111 constitutes a convex lens surface, and provides the function of refracting the laser beam. The material of the emission portion 111 is not particularly restricted, and for example, a polyimide resin, ultraviolet cured acrylic resin, ultraviolet cured epoxy resin, or the like can be used. Of these, an emission portion 111 formed using a polyimide resin has excellent heat resistance.

Operation of the Device

The operation of the surface emission laser 100 is now described.

When a forward potential is applied between the upper electrode 113 and lower electrode 115 of the pin diode, in the active layer 103, recombination of electrons and positive holes occurs, and light is emitted as a result of this recombination. As the generated light bounces between the upper mirror 104 and lower mirror 102, stimulated emission occurs, and the strength of the light is amplified. When the optical gain exceeds the optical loss, laser generation occurs, and laser light is emitted from the aperture 116 through the emission portion 111, in a direction perpendicular to the semiconductor substrate 101.

Device Manufacturing Process

Next, the manufacturing process of the surface emission laser 100 shown in FIG. 1 is described. FIGS. 2 to 5 show steps in the manufacturing process of the surface emission laser 100.

The method of manufacturing the surface emission laser 100 of this embodiment comprises principally the following steps (a) to (e).

Step (a) is a step of forming the resonator 120 including the pillar portion 110 on the semiconductor substrate 101.

Step (b) is a step of forming the upper electrode 113 which supplies current to the resonator 120, with a predetermined region of the upper surface of the pillar portion 110 exposed.

Step (c) is a step of using a substance having non-affinity with a liquid 119 for forming the emission portion 111 which when cured has the form of a convex lens, to embed the periphery of the pillar portion 110, whereby the embedding layer 106 is formed on the periphery of the pillar portion 110, and the pillar portion 110 is given an embedded structure. In this embodiment, the case is shown that the substance used to form the embedding layer 106 is a resin.

Step (d) is a step of disposing the liquid 119 on the upper surface of the pillar portion 110.

Step (e) is a step of curing the liquid 119, to form the emission portion 111.

First step (a) is described with reference to FIG. 2.

(a) On the semiconductor substrate 101 of n-type GaAs, a buffer layer (not shown in the drawings) of n-type GaAs, and the lower mirror 102 of 30 pairs of laminated alternate layers of $Al_{0.2}Ga_{0.8}As$ and $Al_{0.9}Ga_{0.1}$ As, doped with Se are formed. Next, on the lower mirror 102 a, an n-type cladding layer (not shown in the drawings) of n-type $Al_{0.5}Ga_{0.5}As$, a 4-nm thickness GaAs well layer and 4-nm thickness $Al_{0.3}Ga_{0.7}As$ barrier layers form an active layer 103a, in which the well layer has a three-layer structure. Further, on the active layer 103a, a p-type cladding layer (not shown in the drawings) of $Al_{0.5}Ga_{0.5}As$, and the upper mirror 104a of 30 pairs of laminated alternate layers of $Al_{0.2}Ga_{0.8}As$ and $Al_{0.9}Ga_{0.1}As$, doped with Zn are formed. Thereafter, on the upper mirror 104a, a contact layer 105a of p-type GaAs is laminated.

The above described layers can be formed by epitaxial growth using metal-organic vapor phase epitaxy (MOVPE). By way of example, with a growth temperature of 750° C., and growth pressure of 2×10$^4$Pa, as group III materials TMGa (trimethyl gallium) or TMAl (trimethyl aluminum) organic metals can be used, and as group V material AsH$_3$, with H$_2$Se as n-type dopant, and DEZn (diethyl zinc) as p-type dopant.

Figure 2:
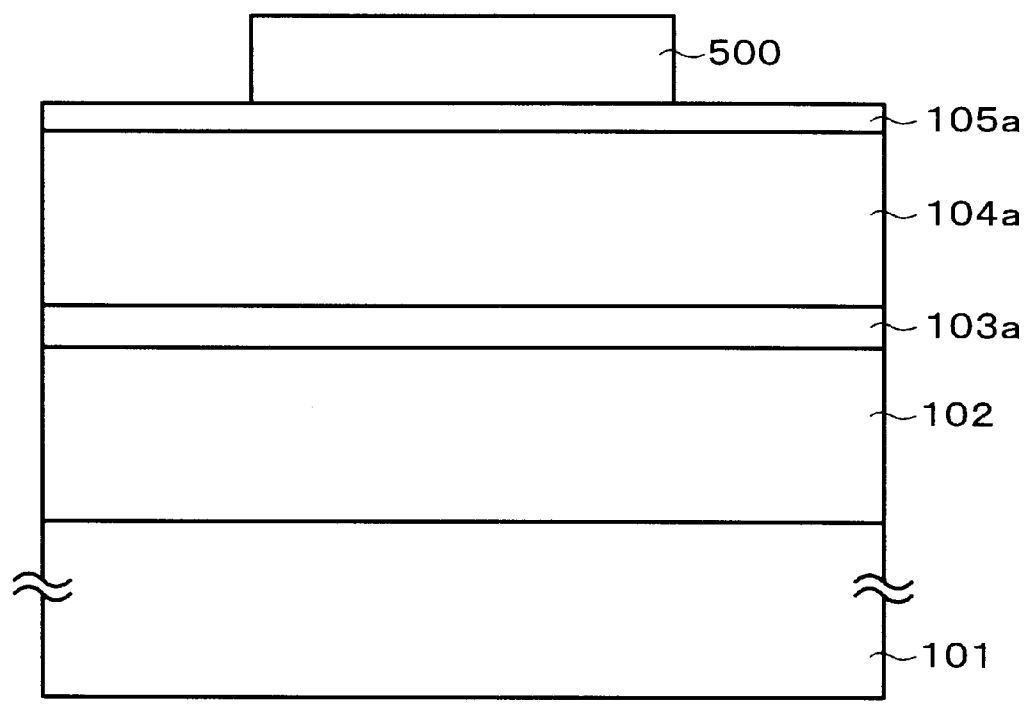
FIG. 2 is a cross-section schematically showing a step in the method of manufacturing a surface emitting semiconductor laser according to one embodiment of the present invention.

Next, on the contact layer 105, a photoresist is applied, and then by means of photolithography, the photoresist is patterned, whereby as shown in FIG. 2, a resist layer 500 of a predetermined shape is formed.

Figure 3:
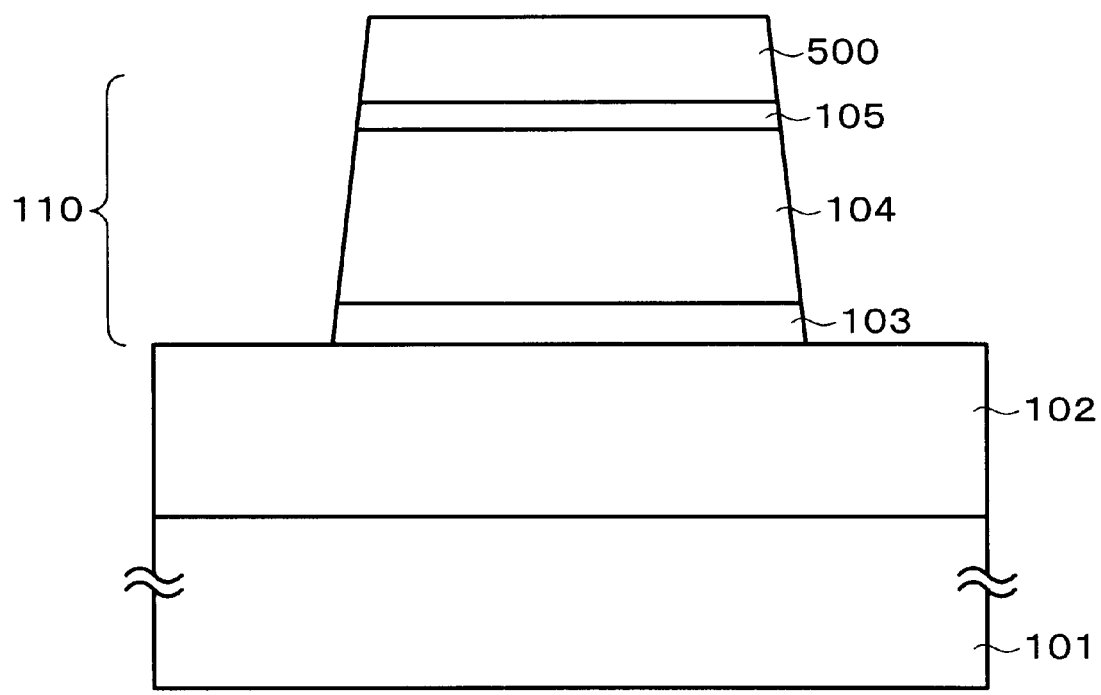
FIG. 3 is a cross-section schematically showing a step in the method of manufacturing a surface emitting semiconductor laser according to one embodiment of the present invention.

Next, as shown in FIG. 3, with the resist layer 500 as a mask, reactive ion etching is used to etch the contact layer 105a, upper mirror 104a, and as far as the active layer 103a in a mesa structure, and form the pillar portion 110. In this etching, normally the reactive ion beam etching method is used, with chlorine or a chlorine-based gas (hydrogen chloride, BCl$_3$) as the etching gas. It should be noted that in this process, the layers etched are not restricted to these, and may be determined appropriately according to the intended resonator shape. By means of the above process, the pillar portion 110 including the contact layer 105, upper mirror 104, and active layer 103 is formed.

Next, step (b) is described.

Figure 4:
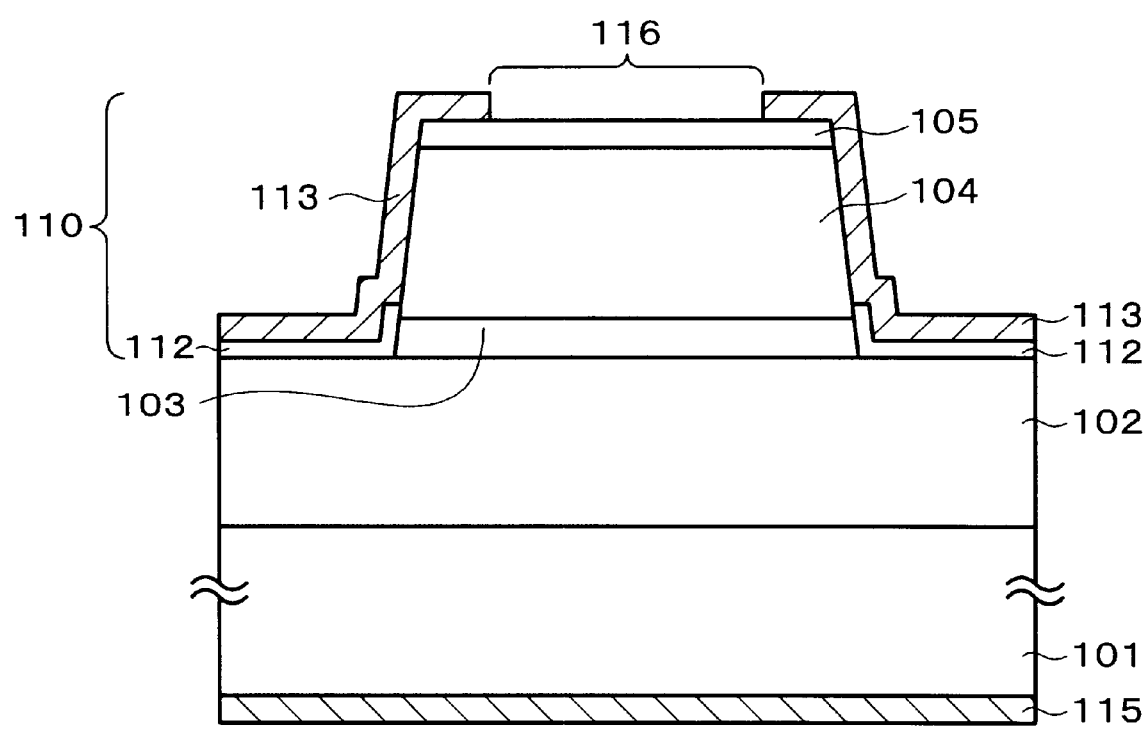
FIG. 4 is a cross-section schematically showing a step in the method of manufacturing a surface emitting semiconductor laser according to one embodiment of the present invention.

(b) As shown in FIG. 4, using SiH$_4$ (monosilane) gas and O$_2$ (oxygen) gas, and N$_2$ (nitrogen) gas as a carrier gas CVD is carried out at normal temperature and pressure, to form a silicon oxide film (SiOX film) of thickness for example 100 to 300 nm on the surface of the resonator 120. Thereafter, by means of photolithography and dry etching, as shown in FIG. 4, excluding a part of the lateral surface of the pillar portion 110 and the upper surface of the lower mirror 102, the silicon oxide film is removed by etching, to form the insulating layer 112.

Next, on the reverse side of the semiconductor substrate 101, by means of vacuum deposition, Au—Ge alloy, Ni, and Au are sequentially deposited to form the lower electrode 115.

Further, as shown in FIG. 4, the upper electrode 113 is formed by a lift-off method to contact the contact layer 105 on the upper surface of the pillar portion 110 in a ring shape, and to cover the lateral surface of the pillar portion 110 and insulating layer 112. The upper electrode 113 can be formed using sequentially deposited metal layers of titanium, platinum, and gold.

Figure 5:
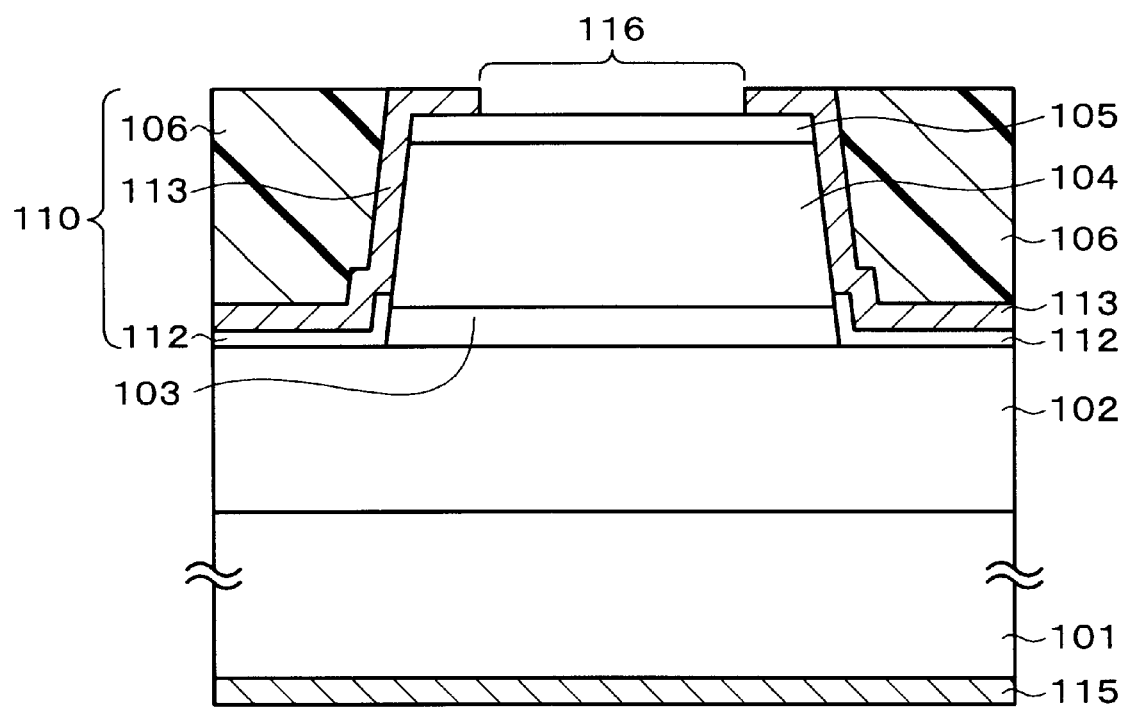
FIG. 5 is a cross-section schematically showing a step in the method of manufacturing a surface emitting semiconductor laser according to one embodiment of the present invention.

Next, with reference to FIG. 5, step (c) is described.

(c) In order that the upper surface of the pillar portion 110 only is exposed, the periphery of the pillar portion 110 is embedded in resin, to obtain the embedding layer 106. The resin used to constitute the embedding layer 106 is one having non-affinity with the liquid used to form the emission portion 111 in the process described below. As this resin, a fluorine-based resin can be used. As examples of a fluorine-based resin may be cited an ultraviolet cured fluorine-based resin, a heat-cured type fluorine-based resin, or a fluorine-based resin cured by chemical reaction in a combination of two liquids. Of these, the ultraviolet cured fluorine-based resin offers easy handling, and is therefore suitable as a resin for forming the embedding layer 106.

It should be noted that the substance used to form the embedding layer 106 is not restricted to a fluorine-based resin, and as long as it adheres to the upper electrode 113, while having non-affinity for the liquid described below, any substance can be used to form the embedding layer 106.

By means of the above process, the embedding layer 106 is formed on the periphery of the pillar portion 110, and the pillar portion 110 is given an embedded structure.

Next, step (d) is described.

Figure 6:
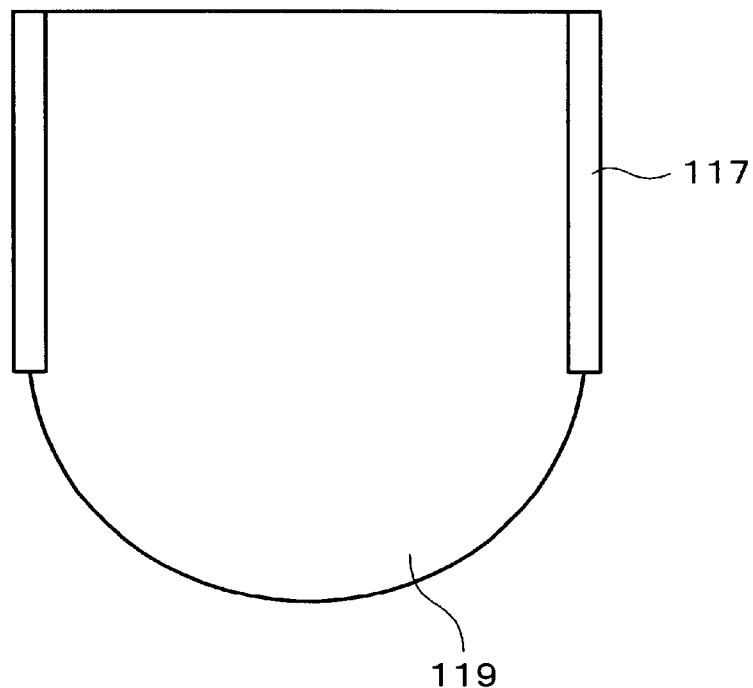
FIG. 6 is a schematic diagram showing the method of supply over time of a liquid to the upper surface of the pillar-form portion by using a nozzle.
Figure 6:
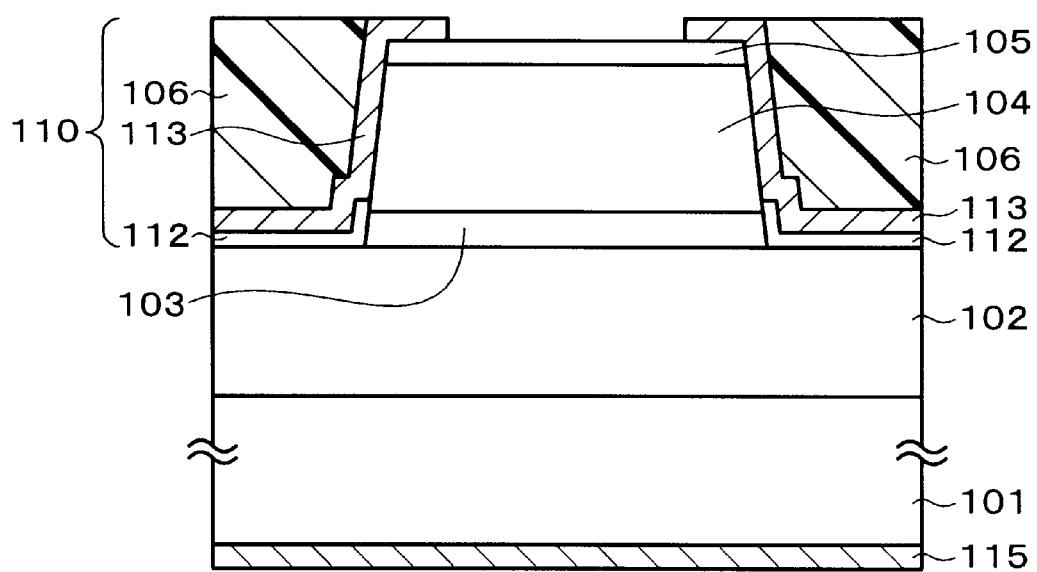
Figure 7:
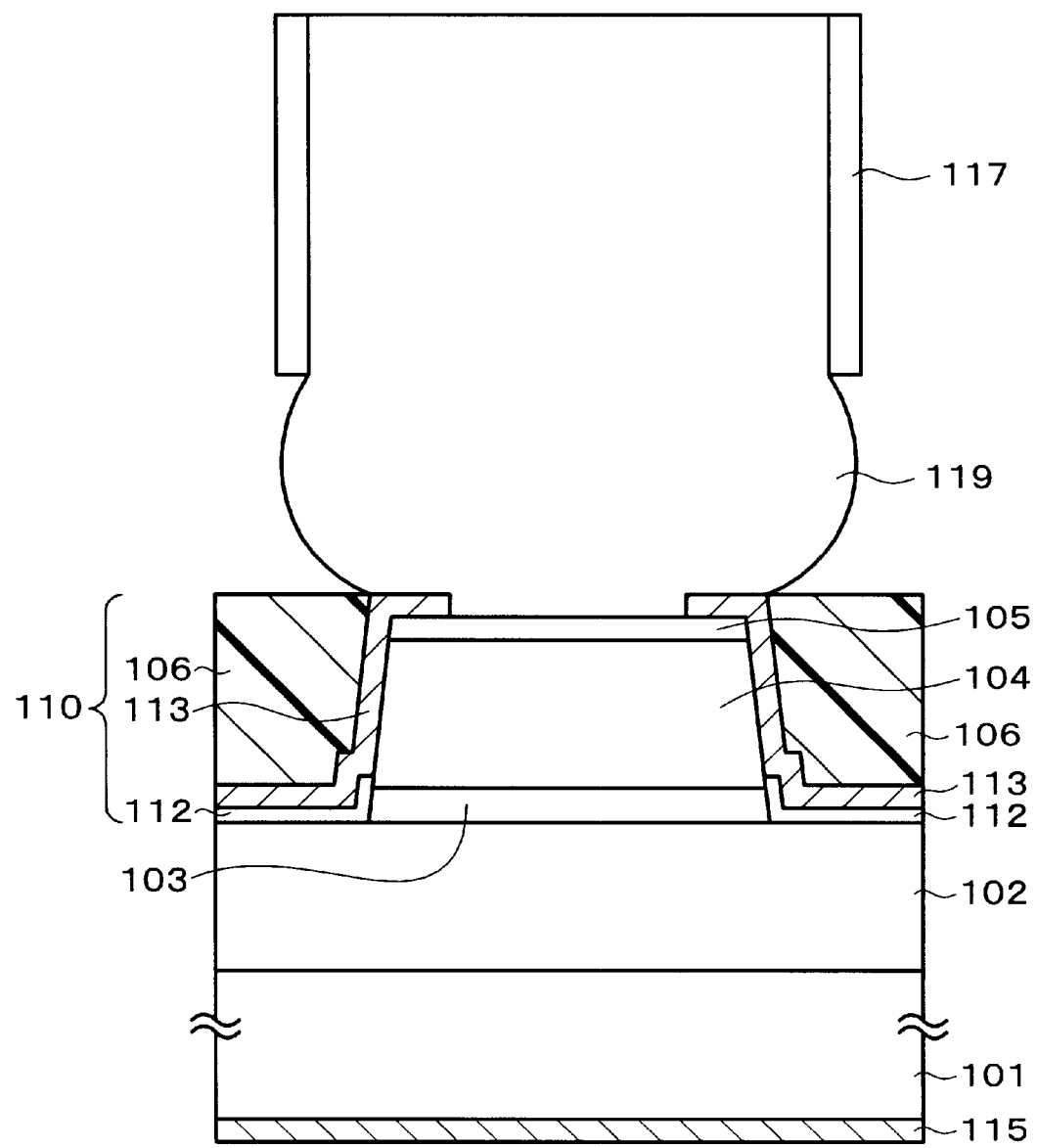
FIG. 7 is a schematic diagram showing the method of supply of a liquid to the upper surface of the pillar-form portion by using a nozzle, continuing from the step shown in FIG. 6.
Figure 8:
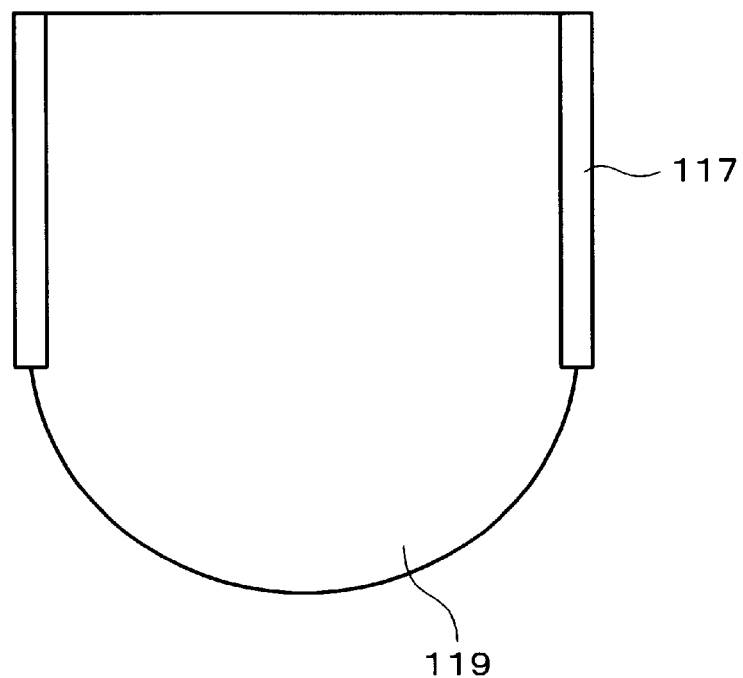
FIG. 8 is a schematic diagram showing the method of supply of a liquid to the upper surface of the pillar-form portion by using a nozzle, continuing from the step shown in FIG. 7.
Figure 8:
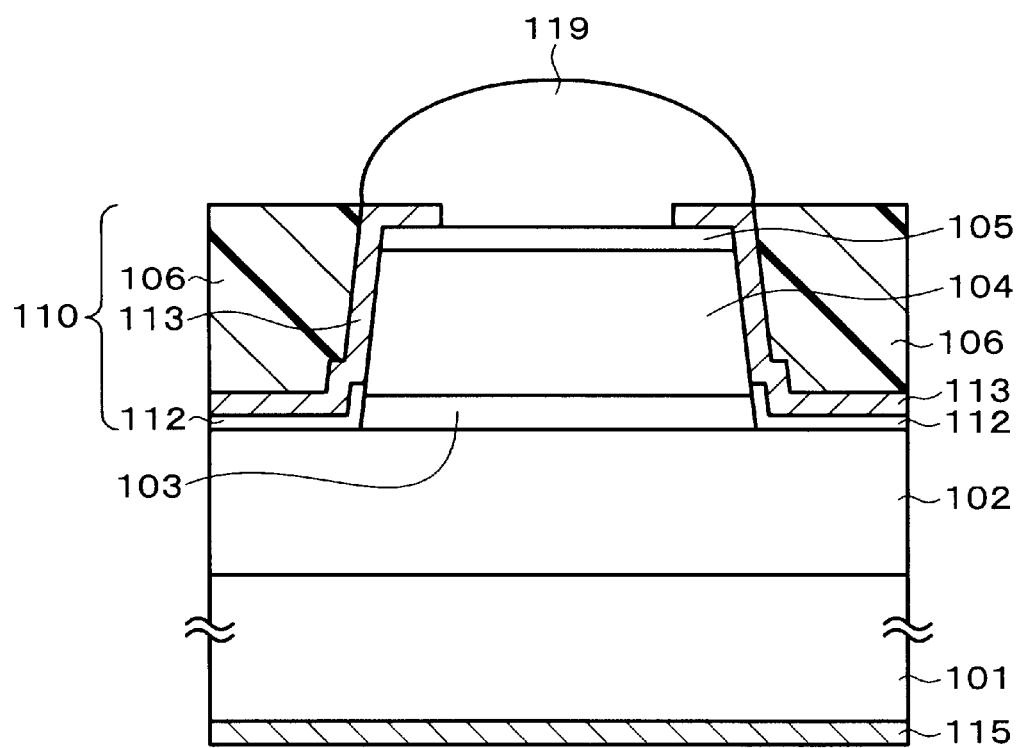

(d) First, a liquid is supplied from a nozzle to the upper surface of the pillar portion 110. This method of supply is described with reference to FIGS. 6 to 8. FIGS. 6 to 8 are schematic diagrams showing the method of supply over time of the liquid 119 from the nozzle to the upper surface of the pillar portion 110.

The liquid 119, being the resin to constitute the material of the laser emission portion or a precursor of the resin, is introduced into a nozzle 117. At the tip of the nozzle 117, as shown in FIG. 6, this liquid forms a drop. Next, as shown in FIG. 7, this drop contacts the upper surface of the pillar portion 110. Then after transfer of the drop to the upper surface of the pillar portion 110, and particularly to the exposed surface of the contact layer 105 and the part of the upper electrode 113 formed on the upper surface of the pillar portion 110, as shown in FIG. 8, the nozzle 117 is withdrawn.

The contact layer 105 and upper electrode 113 are of materials having affinity with the liquid 119. That is to say, the contact layer 105 and upper electrode 113 are of materials which do not repel the liquid 119. Because of this, the liquid 119 transferred to the upper surface of the pillar portion 110 can exist stably on the upper surface of the pillar portion 110 constituted by the exposed contact layer 105 and part of the upper electrode 113. Since the embedding layer 106 is formed of a resin having non-affinity with the liquid 119, even if the liquid 119 spills onto the embedding layer 106, it is repelled by the embedding layer 106. The repelled liquid is absorbed by the liquid formed on the upper surface of the pillar portion 110, and as a result the liquid 119 remains on the upper surface of the pillar portion 110. The remaining liquid 119 is formed by surface tension into a lens shape, which forms the basic shape of the laser emission portion 111.

In this way, by means of supplying the liquid to the upper surface of the pillar portion 110 by the nozzle, the viscosity of the liquid, the nozzle bore, and the drop size on the tip of the nozzle can be adjusted, surface treatment can be applied to the nozzle tip, and so on, so that the thickness of the laser emission portion 111 can easily be controlled. The method of supply of the liquid by a nozzle is not susceptible to the influence of the viscosity of the liquid, and therefore the range of liquids that can be used is wider. Further, since the liquid is positively supplied only to where it is required, and therefore waste is eliminated, and liquid does not adhere to places in which it is not required. As the resin liquid may be cited, for example, ultraviolet cured acrylic resin, ultraviolet cured epoxy resin, or the like. As the precursor liquid may be cited a polyimide precursor liquid, a liquid including a monomer of an ultraviolet cured acrylic resin or ultraviolet cured epoxy resin, or the like.

Since an ultraviolet cured resin can be cured by mere irradiation with ultraviolet radiation, there is no risk of damage to the element by heat, nor of peeling off of the laser emission portion by the differences in thermal expansion of the semiconductor layers and resin generated by heat curing.

The ultraviolet cured resin contains at least one of a prepolymer, oligomer, and monomer, with a photopolymerization initiator.

Specific examples of prepolymers or oligomers for the ultraviolet cured acrylic resin include acrylates such as epoxy acrylates, urethane acrylates, polyester acrylates, polyether acrylates and spiroacetal acrylates and methacrylates such as epoxy methacrylates, urethane methacrylates, polyester methacrylates, and polyether methacrylates.

Examples of monomers include monofunctional monomers such as 2-ethylhexyl acrylate, 2-ethylhexyl methacrylate, 2-hydroxyethyl acrylate, 2-hydroxyethyl methacrylate, N-vinyl-2-pyrrolidone, carbitol acrylate, tetrahydrofurfuryl acrylate, isobornyl acrylate, dicyclopentenyl acrylate and 1,3-butanediol acrylate, bifunctional monomers such as 1,6-hexanediol diacrylate, 1,6-hexanediol dimethacrylate, neopentyl glycol acrylate, polyethylene glycol diacrylate and pentaerythritol diacrylate and polyfunctional monomers such as trimethylolpropane triacrylate, trimethylolpropane trimethacrylate, pentaerythritol triacrylate and dipentaerythritol hexaacrylate.

Examples of photopolymerization initiators include compounds which produce free radicals, including acetophenones such as 2,2-dimethoxy-2-phenylacetophenone, butylphenones such as α-hydroxyisobutylphenone and pisopropyl-a-hydroxyisopropylphenone, halogenated acetophenones such as p-tert-butyltrichloroacetophenone and α,α-dichloro-4-phenoxyacetophenone, bezophenones such as benzophenone and N,N-tetraethyl-4,4-diaminobenzophenone, benzoin derivatives such as benzoin and benzoin alkyl ethers, oximes such as 1-phenyl-1,2-propanediol-2-(Oethoxycarbonyl)oxime, xanthones such as 2-methyloxyxanthone and 2-chlorothioxanthone, benzoin ethers such as benzoin ether and isobutyl bezoin ether and Michleri ketones. When cured, the ultraviolet cured resin has the advantage that it is highly transparent.

Polyimide precursors include polyamic acid and longchain alkyl esters of polyamic acid. Since polyimide resins obtained by heat curing a polyimide precursor exhibit at least 80% transmittance in the visible range and have a high refractive index of 1.7 to 1.9, a highly effective lens is obtained.

Next, Step (e) is Described.

(e) The liquid on the upper surface of the pillar portion 110 is cured, and the surface emission laser shown in FIG. 1 is completed. When the liquid is the above described ultraviolet cured resin, it can be irradiated with ultraviolet radiation, and cured.

When a polyimide precursor liquid is used as the liquid, heat curing is applied to the polyimide precursor liquid, and an imidization reaction occurs, forming the polyimide resin, which can thus be cured. The curing temperature depends on the precursor, but from the viewpoint of avoiding thermal damage to the element, damage to the resin constituting the embedding layer 106, differences in thermal expansion between the substrate and the polyimide resin, and electrode alloying, approximately 150° C. is appropriate. The heat application time is set appropriately that the metal elements constituting the electrode do not diffuse excessively into the semiconductor layer.

Figure 9:
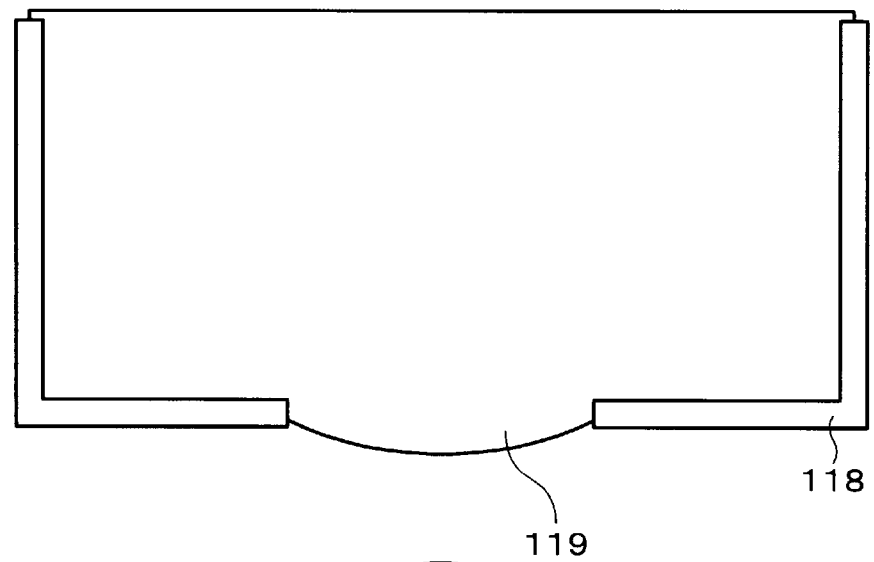
FIG. 9 is a schematic diagram showing the method of supply over time of a liquid to the upper surface of the pillar-form portion by using an inkjet head.
Figure 9:
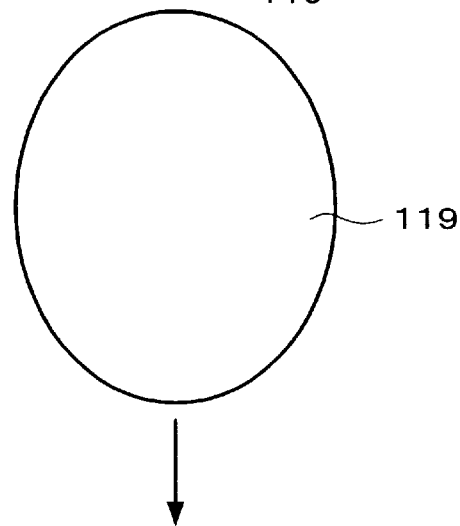
Figure 9:
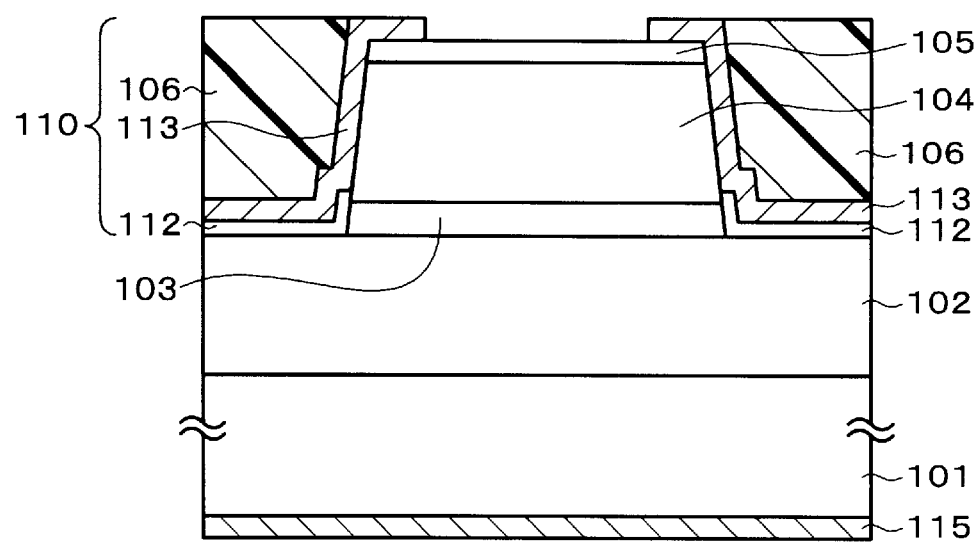
Figure 10:
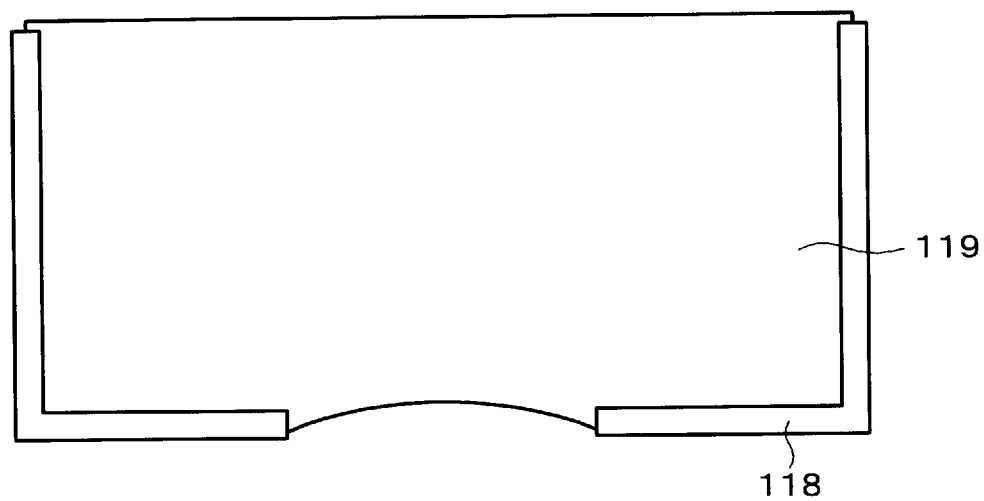
FIG. 10 is a schematic diagram showing the method of supply of a liquid to the upper surface of the pillar-form portion by using an inkjet head, continuing from the step shown in FIG. 9.
Figure 10:
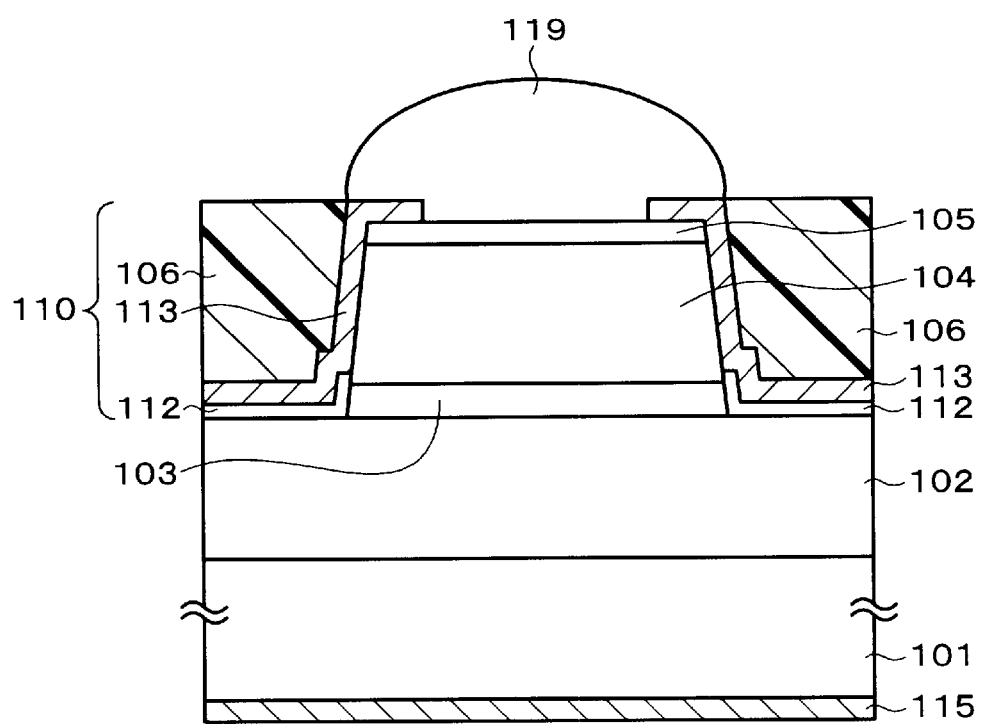

In step (d) above, the example shown is of a supply method using the dispenser nozzle 117 to supply the liquid to the upper surface of the pillar portion 110, but as shown in FIGS. 8 and 9, the method of supply can also be applied in which using an inkjet head 118, the liquid 119 is ejected to the upper surface of the pillar portion 110. The method of using the inkjet head 118 allows the liquid to be supplied to the upper surface of the pillar portion 110 in a short time, and has the advantage of high productivity. When the liquid is supplied by inkjet, the liquid viscosity of the liquid is an important factor, but by adding a solvent to dilute the liquid, the liquid viscosity can be adjusted appropriately.

There are no specific restrictions as to solvents that can be used to dilute the ultraviolet cured resin in the liquid state; however, examples include propylene glycol monomethyl ether acetate, propylene glycol monopropyl ether, methoxymethyl propionate, methoxyethyl propionate, ethyl cellosolve, ethyl cellosolve acetate, ethyl lactate, ethyl pyruvate, methyl amyl ketone, cyclohexanone, xylene, toluene and butyl acetate; these can be used alone, or in mixtures of two or more.

As a solvent which can be used to dilute a polyimide precursor liquid may be cited, for example, N-methyl-2-pyrrolidone.

Further, in addition to this, as the method of supplying the liquid to the upper surface of the pillar portion 110, spin coating, dipping, spray coating, roll coating, bar coating, and so on may be applied as appropriate.

Effect and Benefit

Next, the effect and benefit of the surface emission laser 100 of this embodiment and method of manufacture thereof is described.

(1) In the surface emission laser 100 of this embodiment, as shown in shown in FIG. 1, the emission portion 111 is provided on the upper surface of the pillar portion 110, and further, the upper surface of the emission portion 111, that is to say, the laser emission surface is formed as a convex lens. Since the laser emission surface is formed as a convex lens, at the laser emission surface, the laser beam is refracted, and its emission angle is made narrower. By means of this structure, since the emission angle can be controlled at the laser emission surface, even when the laser emission aperture is large, the emission angle can be made small.

(2) In the method of manufacturing the surface emission laser 100 of this embodiment, a substance having non-affinity with the liquid which forms the emission portion 111 is used to embed the periphery of the pillar portion 110, forming the embedding layer 106, by means of which a difference in wettability of each of the surface of the embedding layer 106 and the upper surface of the pillar portion 110 with the liquid can be achieved. As a result, by simply supplying the liquid to the upper surface of the pillar portion 110, and curing the liquid, the laser emission portion 111 functioning as a microlens can be formed by self-alignment. By means of the above process, the laser emission portion 111 with no deviation from the optical axis and requiring no alignment of the optical axis can be formed by a process of extreme simplicity.

In particular, when a fluorine-based resin is used as the substance for forming the embedding layer 106, a large difference can be obtained between the wettability of the upper surface of the pillar portion 110 by the liquid and the wettability of the surface of the embedding layer by the liquid can be obtained. As a result, by the use of a fluorine-based resin as the substance to form the embedding layer 106, since the control of the size can be carried out more precisely, an emission portion can be obtained with even less deviation from the optical axis.

(3) The diameter of the emission portion 111 in the plane of adhesion of the pillar portion 110 and emission portion 111 can be made substantially equal to the diameter of the upper surface of the pillar portion 110. By means of this, particularly when the surface emission laser 100 is formed in an array, emission portions 111 of uniform size can be formed. By making the diameter of the emission portion 111 in the plane of adhesion of the pillar portion 110 and emission portion 111 and the diameter of the upper surface of the pillar portion 110 substantially equal, the optical axis of the emission portion 111 and an axis being perpendicular to the upper surface of the pillar portion 110 and passing through the center of the pillar portion 110 substantially coincide. The optical axis of the emitted laser light is substantially coincident with the axis passing through the center of the pillar portion 110 and perpendicular to the upper surface of the pillar portion 110. As a result, in the surface emission laser 100, the optical axis of the emission portion 111, the optical axis of the emitted laser light, and the axis passing through the center of the pillar portion 110 and perpendicular to the upper surface of the pillar portion 110 substantially coincide, and therefore a surface emitting semiconductor laser with little deviation from the optical axis can be obtained.

It should be noted that in the above described embodiment, the p-type and n-type semiconductor layers may be interchanged, without departing from the essence of the present invention. In the above described embodiments, the description has been of a Al—Ga—As type of material, but depending on the wavelength of radiation to be generated, other materials, for example, In—P type, In—Al—As type, Ga—In—As type, Ga—In—N type, Al—Ga—In—P type, Ga—In—N—As type, Al—Ga—In—As type, Ga—In—As—P type, and so on, of semiconductor materials can be used.

In the above described embodiments the method of driving a surface emission laser is but one example, and without departing from the essence of the present invention, various variations are possible. In the above described embodiments, a surface emission laser is shown in which there is a single pillar portion, but the present invention will not suffer from being implemented with a substrate surface on which there is a plurality of pillar portions.

What is claimed is:

1. A surface emitting semiconductor laser which has a resonator formed on a semiconductor substrate in a direction perpendicular to the semiconductor substrate, to emit laser light from the resonator in a direction perpendicular to the semiconductor substrate, wherein:

a pillar-form semiconductor deposition is provided in at least part of the resonator;

an emission portion having a convex lens form is formed on an upper surface of the semiconductor deposition;

the semiconductor deposition has an embedded structure, and is embedded in an embedding layer; and the embedding layer is formed from a substance having non-affinity with a material used to form the emission portion.

2. The surface emitting semiconductor laser as defined in claim 1, wherein the substance is a resin.

3. The surface emitting semiconductor laser as defined in claim 2, wherein the resin is a fluorine-based resin.

4. The surface emitting semiconductor laser as defined in claim 1, wherein an electrode which supplies current to the resonator is formed on the upper surface of the semiconductor deposition.

5. The surface emitting semiconductor laser as defined in claim 4, wherein the electrode is formed of a metal.

6. The surface emitting semiconductor laser as defined in claim 1, wherein the diameter of the emission portion in a plane of adhesion of the semiconductor deposition and the emission portion, and the diameter of the upper surface of the semiconductor deposition are substantially equal.

7. The surface emitting semiconductor laser as defined in claim 1, wherein the emission portion is formed of a polymer compound.

* * * * *